United States Patent [19]
Veneklasen et al.

[11] Patent Number: 5,838,006
[45] Date of Patent: Nov. 17, 1998

[54] CONICAL BAFFLE FOR REDUCING CHARGING DRIFT IN A PARTICLE BEAM SYSTEM

[75] Inventors: Lee H. Veneklasen, Castro Valley; Lydia J. Young, Palo Alto, both of Calif.

[73] Assignee: Etec Systems, Inc., Hayward, Calif.

[21] Appl. No.: 733,673

[22] Filed: Oct. 17, 1996

[51] Int. Cl.[6] .................................................. H01J 37/09
[52] U.S. Cl. ...................................... 250/310; 250/505.1
[58] Field of Search .................................. 250/310, 311, 250/503.1, 505.1

[56] References Cited

U.S. PATENT DOCUMENTS

| | | | |
|---|---|---|---|
| 4,352,015 | 9/1982 | Jore et al. | 250/311 |
| 4,508,967 | 4/1985 | Boissel et al. | 250/505.1 |
| 5,185,530 | 2/1993 | Norioka et al. | 250/310 |
| 5,362,964 | 11/1994 | Knowles et al. | 250/310 |

FOREIGN PATENT DOCUMENTS

| | | |
|---|---|---|
| 0 312 066 | 4/1989 | European Pat. Off. . |
| 0 449 740 A1 | 10/1991 | European Pat. Off. . |
| 3433491 A1 | 4/1985 | Germany . |
| 2 215 907 | 9/1989 | United Kingdom . |

Primary Examiner—Bruce Anderson
Attorney, Agent, or Firm—Skjerven, Morrill, MacPherson, Franklin & Friel LLP; Norman R. Klivans

[57] ABSTRACT

A conical shaped baffle aperture reduces beam position drift due to electrostatic charging of insulating contamination layers on beam tube walls of a charged particle beam system. The geometric cone angle, aperture size and apex location of the baffle with respect to the source of contamination and secondary radiation are selected so that the inner walls of the baffle and the beam itself are invisible from the source, and therefore remain free of the insulating contamination layers that would otherwise cause charging drift.

18 Claims, 3 Drawing Sheets

CONICAL BAFFLE FOR REDUCING CHARGING DRIFT IN A PARTICLE BEAM SYSTEM

BACKGROUND OF THE INVENTION

1. Field of the Invention

This invention relates to charged particle beams and more specifically to reducing beam position drift due to electrostatic charging of the beam tube walls in a charged particle beam system.

2. Description of the Prior Art

Electron beam lithography and inspection systems, scanning electron microscopes, and particle accelerators irradiate surfaces with charged particle beams, striving to accurately position these beams on a surface. Beam drift that degrades positioning accuracy is often caused by electrostatic charging of the walls of the beam tube. Turning the beam on and off, or deflecting it to different sites on a substrate or aperture, can change the charging state within the beam tube, causing varying electric fields that in turn cause create unwanted beam drift.

A clean metal surface does not charge because it is a conducting surface. However, in time metal surfaces can accumulate adsorbed molecules from the vacuum conventionally present or from surface diffusion. When exposed to a particle beam, this contamination layer can polymerize, building up a insulating layer that can store charge. Both mobile polymerizable molecules and irradiation must usually be simultaneously present for polymerization to occur, so it is known that it is desirable to minimize the flux of both molecules and charged particles on all surfaces near the beam path.

Many prior art particle beam systems use a flat disk aperture with a hole as an anti-charging baffle. Electron microscopes also use threaded holes and differential pumping apertures to discourage charging drift. The AEBLE EBL system introduced by Etec Systems in the early 1980s used both flat and conical shaped apertures, but geometrical constraints prevented the conical baffles from operating efficiently according to the teachings of this invention.

FIG. 1A illustrates prior art baffling of a beam tube to minimize contamination. With the flat disk-shaped baffle 10, sublimated material and secondary particles 12 from the substrate 14 (or from other electron optical elements such as beam apertures located below the baffle 10) and ejected by the beam 18 can accumulate on the baffle 10 lower surfaces, building up an insulating layer 16 that can charge, as shown by the plus signs. A similar insulating layer 16 builds up on the beam tube 19 inner walls. If the charging is asymmetric, it creates an electric field acting upon the beam 18 within or at the end of the beam tube 19 causing undesirable beam drift. A series of flat baffle apertures 10A, 10B, 10C as in FIG. 1B may also be used to minimize the irradiated surface in beam tube 16, but they also do not effectively shield the beam 18 from electric fields that arise from charging of the lower surfaces of the baffles.

SUMMARY

The present improved baffle efficiently prevents secondary particles and backscattered radiation from a substrate or an aperture hitting interior surfaces anywhere along the beam path. This is done by providing the baffle with a particular conical configuration.

The present baffle which minimizes charging drift in a particle beam column includes a thin walled conical structure with a hole at its point (apex) that allows the beam to pass through it. The apex of the cone is oriented facing the source of molecules or secondary charged particles generated by the primary beam, i.e. facing a substrate or an optical element which is being irradiated. The apex angle of the cone is chosen to be just large enough to make the inner walls of the cone "invisible" from the source of secondary contamination and irradiation particles, but also small enough to act as a coaxial shield to prevent charging on outer walls of the beam tube. (The charged particles or molecules coming from the substrate as backscatter or secondary radiation usually travel in a line-of-sight from the substrate back towards the baffle.) The baffle hole size is such that the primary beam can pass through, but returning secondary or backscattered particles moving in a straight line or in focusing trajectories cannot hit optical elements further upstream. This prevents formation of charging layers along the beam path, thereby minimizing charging drift.

DETAILED DESCRIPTION

Figure 2:
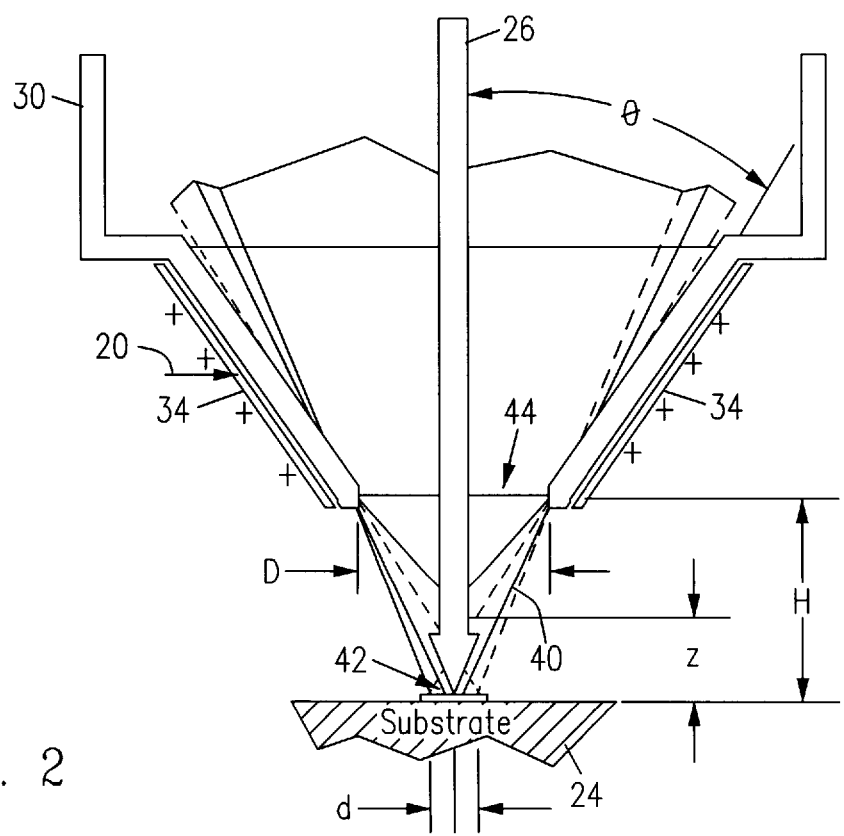
FIG. 2 shows in a cross section a conical baffle according to this invention, showing how the cone angle is chosen so that contamination and charging occur on the outside rather than inside of the baffle.

FIG. 2 illustrates in cross section a single conical baffle 20 located above a substrate 24 (or aperture) and dimensioned according to this invention. The primary beam 26 passes downward through the center of the beam tube 30, hitting the substrate 24. Heating or electron bombardment causes molecules e.g. of photoresist to evaporate from the substrate 24 surface, creating a molecular beam passing back upwards toward the baffle 20. A flux 40 of secondary electrons, backscattered electrons, and ions is also created at the substrate 24. If this flux 40 of secondary products hits the beam tube 30 or an interior surface of baffle 20, the flux can polymerize material and build up a thick polymerized layer 34 that supports a surface charge as shown by the plus signs. Depending upon the position and intensity of the primary beam 26, the state of this surface charge can change, causing a varying deflection field. If this field can influence the beam 26 it causes undesirable beam position drift.

Figure 1A:
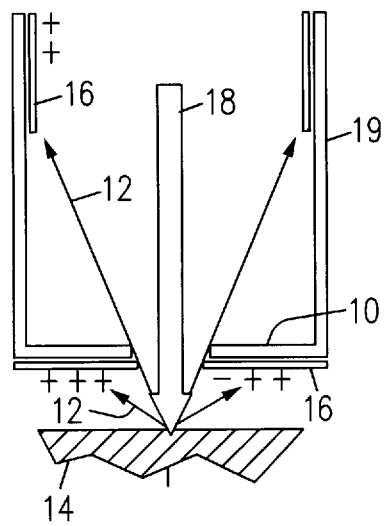
FIG. 1A shows in cross section a prior art baffle using one flat aperture.
Figure 1B:
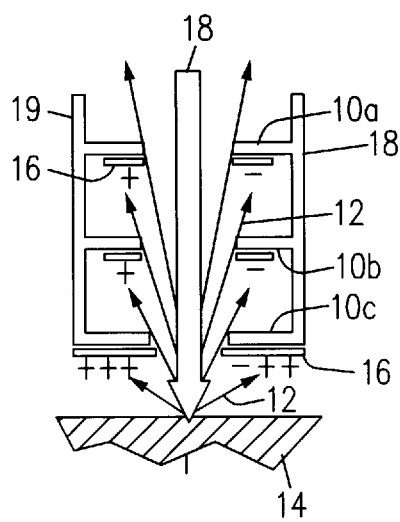
FIG. 1B shows prior art baffles in series.

FIG. 2 illustrates that the secondary flux 40 from a source 42 of secondary flux hits the outside, but not the inside, of the baffle 20 because the surface of baffle 20 is angled in such a way as to be invisible (not in a line of sight) from the irradiated area or scan field area having diameter d on substrate 24. The source of secondary flux 42 is the area of substrate 24 irradiated by the beam, i.e. the diameter of beam 26 plus its maximum deflection. The necessary geometrical condition for this as determined by the present inventors is that the cone angle of the baffle 20 is slightly larger than the cone angle of the scattered beam (flux) 40 passing back up through the hole 44 in baffle 20. Expressed another way, the condition is that the imaginary apex of the cone defined by baffle 20 lies some minimum distance above the substrate 24 (or source of scattered material 40). If the baffle 20 inner surface is shielded from molecular flux 40, then a minimum amount of material reaches the inner surface of baffle 20. If in addition, no charged particle flux 40 reaches the inner surface, then residual material on the inner surface of baffle 20 cannot be polymerized and the interior buildup of insulating layers (as in FIG. 1A) is eliminated.

There is unavoidably a flux 40 upon the outside surface of the baffle 20, and will this will contaminate the surface at layer 34 and charge up. However, with decreasing baffle cone angle, charging on the outside of the baffle 20 has much less influence upon the beam, because the undesirable resulting electric fields are coaxially shielded from the beam 26 path. The smaller the cone angle 20, and the closer the baffle hole 44 to the substrate 24, the more effective the shielding. For optimum shielding, diameter of the hole 44 in the baffle 20 should not be much larger than the combined diameter and deflection range of the primary beam 26. (It is to be understood that the beam 26 typically is scanned, i.e. deflected, across the surface of substrate 24.) Scattered flux 40 upon the outside surface of baffle 20 may be reduced by minimizing the area of baffle 20 visible from the substrate 24, so the cone angle should be as steep as the geometry otherwise allows. Thus there is an optimum size of hole 44 and optimum baffle cone angle for most effective baffling.

The present inventors have determined the geometric relationship between the hole 44 diameter D and its distance H from the substrate 24, the cone apex angle θ and apex position z, and the maximum diameter d irradiated by the beam 26. For optimum baffling they are related mathematically as follows:

$$\tan\theta > (D+d)/2H, \text{ and } z > Hd/(D+d)$$

Figure 3:
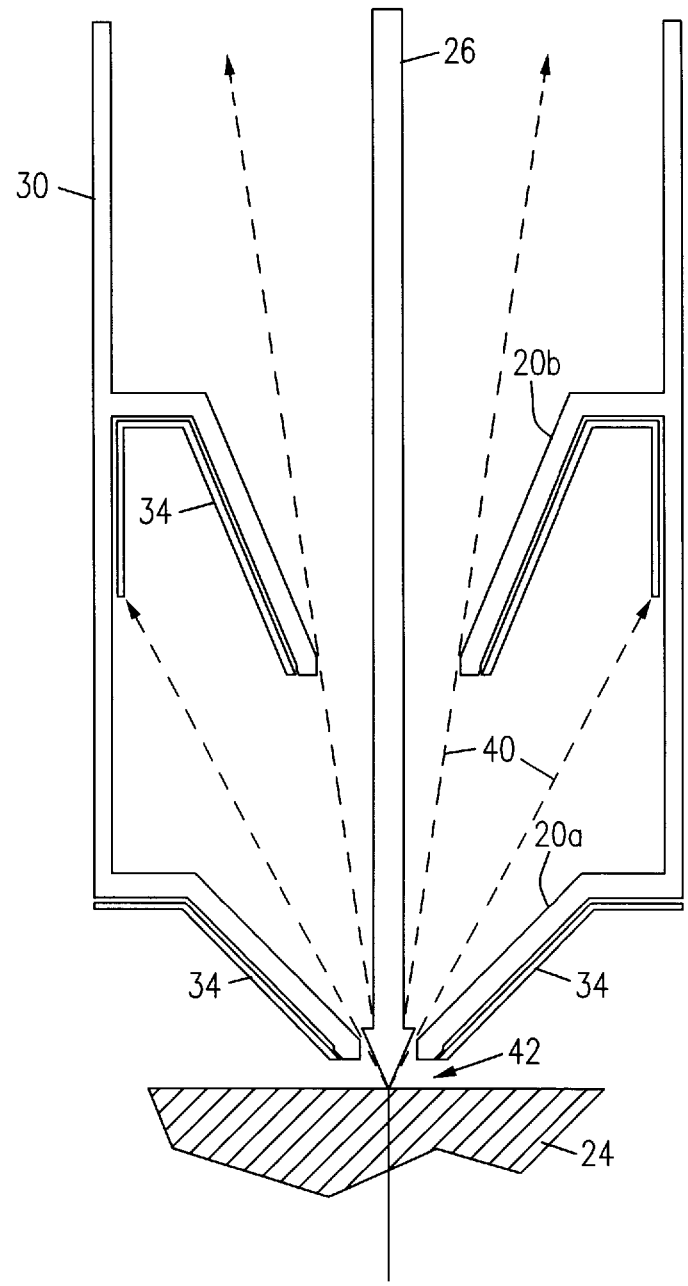
FIG. 3 shows in cross section a tandem arrangement of several conical baffles used to shield the walls of a beam tube.

FIG. 3 illustrates an additional application where several such conical baffles 20a, 20b are used in series to shield the cylindrical walls of a beam tube 30 from charging, with various elements common to FIG. 2 being similarly labeled. The lower conical baffle 20a is placed near the substrate 24 to skim off some of the secondary flux 40 from the substrate. A second baffle 20b further upstream intercepts the remaining secondary flux 40 that would otherwise hit the walls, electrostatic deflection plates or other optical elements in the beam tube 30. Such series of conical baffles allows the use of a larger baffle holes than possible with a single baffle, while limiting the insulating layer 34 buildup to the areas as shown.

It is to be understood that the above reference to the apex of the cone pointing to an aperture instead of a substrate is either for the case of an upper baffle 20b as in FIG. 3 or for the case of a baffle located in the beam tube and inverted relative to the baffles of FIG. 3, to prevent radiation penetrating the edges of an aperture from going down the beam tube.

Figure 4:
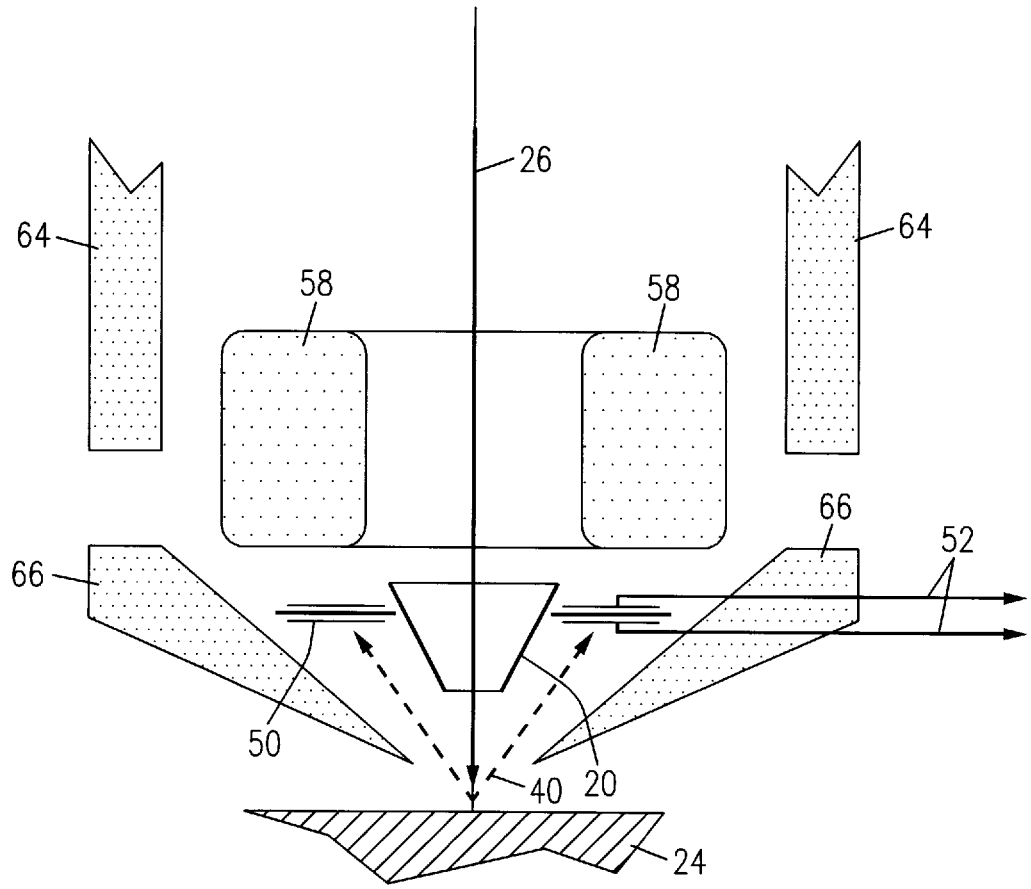
FIG. 4 shows the present conical baffle used in a magnetic deflector lens.

A third aspect according to this invention relates to the conical baffle material. To minimize contamination, it is desirable to use a material with low adsorption (sticking) coefficient and/or a low surface diffusion rate for polymerizable hydrocarbon molecules. These molecules are dislodged from the substrate, such as photoresist, or are oils or other materials contaminating the vacuum system. Where the conical baffle is used in one embodiment within a magnetic deflection field as shown in FIG. 4, it is also desirable to use a high resistivity material for the baffle to avoid eddy current effects that would influence beam deflection speed. Hence baffle materials such as pyrolitic graphite or titanium, a non-magnetic material are favored under various conditions.

FIG. 4 illustrates an exemplary use of the present baffle 20 located inside a magnetic deflector assembly having conical-shaped lower pole pieces of the type disclosed in U.S. Pat. No. 5,729,022 issued Mar. 17, 1998, entitled "Composite Concentric-Gap Magnetic Lens With Conical Pole Pieces" invented by Lee H. Veneklasen and William J. Devore, incorporated herein by reference. In one embodiment this deflection assembly also accommodates inside it and located below the conical baffle a particle detector 50 of the type disclosed in U.S. patent application Ser. No. 08/726,449, filed Oct. 4, 1996, now abandoned entitled "Mounting A Solid State Particle Detector Within A Magnetic Deflection Field", invented by Lee H. Veneklasen and Rudy Garcia, also incorporated herein by reference. The baffle location of FIG. 4 is only illustrative; as shown in FIG. 3, the baffle may alternatively be located below the deflection assembly, nearer the substrate.

Also shown in FIG. 4 are the beam 26, and substrate 24 as in FIG. 2. The annular shaped particle detector 50, having output leads 52, detects secondary or backscattered particle flux 40 from substrate 24. The magnetic deflector includes toroidal or saddle-shaped deflector coil(s) 58 to deflect beam 26. Also shown are cylindrical upper pole pieces 64 and the conical shaped lower pole pieces 66; baffle 20 is shown inside the conical lower pole pieces 66.

This disclosure is illustrative and not limiting; further modifications will be apparent to one skilled in the art in light of this disclosure and are intended to fall within the scope of the appended claims.

What is claimed is:

1. A particle beam system having a primary particle source providing a beam of charged particles, a deflector for deflecting the beam, comprising a conical baffle structure arranged concentric to the beam and spaced apart from the primary particle source, the baffle structure being open near its apex, the apex being closer to a source of secondary particles generated by the primary beam than is the base of the cone, wherein an angle of a cone defined by the baffle structure prevents a secondary particle from passing into the opening to an interior surface of the baffle structure, wherein the baffle structure is disposed inside the deflector.

2. The system of claim 1, wherein a tangent of the cone angle is greater than (D+d)/2H, where D is a diameter of the baffle structure opening at its apex, d is a diameter of an area of the secondary particle source irradiated by the beam, and H is a distance from the secondary particle source to the baffle structure opening.

3. A particle beam system having a particle beam and a deflector for deflecting the beam, and comprising a baffle spaced apart from a source of secondary particles generated by the particle beam and the baffle being a truncated cone in shape, a base of the cone being located away from the source of secondary particles and the truncated portion of the cone being located nearer the source of secondary particles, the cone being arranged to prevent the secondary particles from entering an interior of the cone, wherein the baffle is disposed inside the deflector.

4. A method for preventing secondary particles generated by a particle beam impinging on a surface from impinging on a surface of a beam tube for the beam, the method comprising:

generating a particle beam;

deflecting the particle beam onto the surface using a deflector;

baffling all the secondary particles from impinging on the surface of the beam tube using a conical shaped baffle disposed inside the deflector.

5. The method of claim 4, wherein the surface of the beam tube is its interior surface.

6. A particle beam system having a primary particle source providing a beam of charged particles, a deflector for deflecting the beam, comprising a conical baffle structure arranged concentric to the beam and spaced apart from the primary particle source, the baffle structure being open near its apex, the apex being closer to a source of secondary particles generated by the primary beam than is the base of the cone, wherein an angle of a cone defined by the baffle structure prevents a secondary particle from passing into the opening to an interior surface of the baffle structure;

wherein a tangent of the cone angle is greater than (D+d)/2H, where D is a diameter of the baffle structure opening at its apex, d is a diameter of an area of the secondary particle source irradiated by the beam, and H is a distance from the secondary particle source to the baffle structure opening.

7. The system of claim 6, wherein the baffle structure is of a high resistivity material.

8. The system of claim 6, wherein the secondary particle source is a substrate which is irradiated by the beam.

9. The system of claim 6, wherein the secondary particle source is an aperture for the beam downstream with regard to the beam of the baffle structure.

10. The system of claim 6, wherein the secondary particle source is an aperture for the beam upstream with regard to the beam of the baffle structure.

11. The system of claim 6, wherein the secondary particle source is an aperture through which the beam passes.

12. The system of claim 6, wherein the baffle structure is a thin walled structure.

13. The system of claim 6, wherein the baffle structure is a material known to have at least one of a low adsorption coefficient and a low diffusion rate for polymerizable hydrocarbons.

14. The system of claim 6, wherein the baffle structure is disposed inside the deflector.

15. The system of claim 6, further comprising at least a second conical baffle structure disposed concentric to the particle beam and spaced apart from the first baffle structure.

16. The system of claim 6, further comprising a beam tube concentric to the beam, wherein the baffle structure is disposed inside the beam tube.

17. The system of claim 6, wherein a distance from the apex of the cone to a surface of the secondary particle source is greater than HD/(D+d), where H is a distance from the secondary particle source to the baffle structure opening, D is a diameter of the baffle structure opening, and d is a diameter of the beam at the secondary particle source.

18. The system of claim 6, wherein a diameter of the opening in the baffle structure prevents the secondary particles from impinging on an exterior surface of the beam housing.

* * * * *